(12) United States Patent
Harrison et al.

(10) Patent No.: US 8,581,114 B2
(45) Date of Patent: Nov. 12, 2013

(54) PACKAGED STRUCTURE HAVING MAGNETIC COMPONENT AND METHOD THEREOF

(75) Inventors: William Lee Harrison, Sacramento, CA (US); Jung-Chien Chang, Xinzhuang (TW)

(73) Assignees: Planarmag, Inc., West Sacramento, CA (US); Mutual-Tek Industries Co., Ltd., Xinzhuang, Taipei County (TW)

( * ) Notice: Subject to any disclaimer, the term of this patent is extended or adjusted under 35 U.S.C. 154(b) by 346 days.

(21) Appl. No.: 12/699,777

(22) Filed: Feb. 3, 2010

(65) Prior Publication Data

US 2011/0108317 A1    May 12, 2011

(30) Foreign Application Priority Data

Nov. 12, 2009    (TW) ................ 98138380 A

(51) Int. Cl.
*H05K 1/11*    (2006.01)
*H01F 17/00*   (2006.01)

(52) U.S. Cl.
CPC .................... *H01F 17/0033* (2013.01)
USPC ............................. 174/266; 361/782

(58) Field of Classification Search
CPC ................................ H01F 17/0033
USPC .......... 174/258–266, 391, 396; 361/782, 762, 361/763, 764, 771, 783, 807, 809–812; 29/852; 336/200, 229, 206–208
See application file for complete search history.

(56) References Cited

U.S. PATENT DOCUMENTS

| | | | | |
|---|---|---|---|---|
| 5,781,091 A | * | 7/1998 | Krone et al. | 336/200 |
| 5,959,846 A | * | 9/1999 | Noguchi et al. | 361/782 |
| 7,436,282 B2 | * | 10/2008 | Whittaker et al. | 336/200 |
| 2009/0077791 A1 | * | 3/2009 | Quilici | 29/602.1 |

* cited by examiner

*Primary Examiner* — Yuriy Semenenko
(74) *Attorney, Agent, or Firm* — Abe Hershkovitz; Hershkovitz & Associates PLLC

(57) ABSTRACT

A packaged structure having a magnetic component and a method of manufacturing the same are provided. The packaged structure includes an insulating substrate having a ring-typed recess, an island portion and a surrounding portion defined by the ring-typed recess, wherein the ring-typed recess is laterally between the island portion and the surrounding portion. The packaged structure further includes a ring-typed magnetic component placed in the ring-typed recess; an upper wiring layer above the insulating substrate and a lower wiring layer under the insulating substrate; an inner plated through hole vertically passing through the island portion and connecting the upper wiring layer and the lower wiring layer; an outer plated through hole vertically passing through the surrounding portion and connecting the upper wiring layer and the lower wiring layer, wherein the inner plated through hole, the outer plated through hole, the upper wiring layer and the lower wiring layer form a coil of wire surrounding the ring-typed magnetic component.

2 Claims, 16 Drawing Sheets

PACKAGED STRUCTURE HAVING MAGNETIC COMPONENT AND METHOD THEREOF

RELATED APPLICATIONS

This application claims the right of priority based on Taiwan Patent Application No. 098138380 entitled "PACKAGED STRUCTURE HAVING MAGNETIC COMPONENT AND METHOD THEREOF", filed on Nov. 12, 2009, which is incorporated herein by reference. This application is also cross referenced to PCT/US2008/000154 entitled "Wideband Planar Transformers", filed on Jan. 4, 2008, and PCT/US2009/006346 entitled "The Manufacture and Use of Planar Embedded magnetic as Discrete Components and In Integrated Connectors", filed on Dec. 3, 2008, which are incorporated herein by reference.

FIELD OF INVENTION

The invention generally relates to a packaged structure, and more particularly, to a packaged structure having a magnetic component integrated into a printed circuit board.

BACKGROUND OF THE INVENTION

Recently, the integration of magnetic components into a PCB or onto semiconductor platforms has drawn much attention from developers in the electronic field. FIGS. 1A to 1C illustrate one of the current methods embedding magnetic components into a PCB. As shown in FIG. 1A, an insulating substrate 100 having a cavity 110 is provided. The insulating substrate can be an epoxy based glass fiber substrate. Next, as shown in FIG. 1B, place a toroidal magnetic component 120 into the cavity 110. Then, as shown in FIG. 1C, fill the cavity with epoxy gel 130 to cover the magnetic component 120 and seal the cavity 100 by solidifying the epoxy gel 130. Thereafter, drill through holes 140 on an inside of the toroidal magnetic component 120 where the solidified gel is filled. The through holes 140 are then plated. The resultant structure after plating is shown in FIG. 1C. Another plated through holes 150 penetrating the substrate 100 on an outside of the toroidal magnetic component 120 are also made at the same time. Thereafter, form surface metal lines to contact the through holes 140 and 150, and thereby a coil conductor surrounding the toroidal magnetic component 120 is completed.

Lots of conventional technologies provide methods and structures similar to what is introduced above. However, with the conventional methods and structures accompanying drawbacks are sometimes inevitable. Therefore, there is always a need of providing an innovative way to improve the conventional technologies.

SUMMARY OF THE INVENTION

The conventional structure, such as that in FIG. 1C, has difficulties to resist certain severe conditions or fails to support some special layers to be placed thereon. It is discovered that the portion made of the epoxy gel 130 being penetrated by the inner through holes 140 is not strong enough or that the gel 130 places undue stress on the magnetic component 120. One aspect of the invention to resolve the problem is therefore contemplated.

The aspect of the present invention is to provide a package structure comprising an insulating substrate having a ring-typed recess, an island portion and a surrounding portion defined by the ring-typed recess, wherein the ring-typed recess is laterally between the island portion and the surrounding portion; a ring-typed magnetic component placed in the ring-typed recess in open air; an upper wiring layer above the insulating substrate and a lower wiring layer under the insulating substrate; an inner plated through hole vertically passing through the island portion and connecting the upper wiring layer and the lower wiring layer; an outer plated through hole vertically passing through the surrounding portion and connecting the upper wiring layer and the lower wiring layer, wherein the inner plated through hole, the outer plated through hole, the upper wiring layer and the lower wiring layer form a coil of wire surrounding the ring-typed magnetic component.

Another aspect of the present invention is to provide a method of forming a package structure providing a conductor-cladded insulating substrate and defining the conductor-cladded insulating substrate as a ring-typed region, an isolation portion and a surrounding portion of, wherein the ring-typed region is laterally between the island portion and the surrounding portion, and the surrounding portion is for enclosing a ring-typed magnetic component surrounded by open air; forming an inner plated through hole vertically penetrating the island portion and an outer plated through hole vertically penetrating the surrounding portion; forming a ring-typed recess in the ring-typed region of the conductor-cladded insulating substrate; placing the ring-typed magnetic component in the ring-typed recess; forming an upper wiring layer above the conductor-cladded insulating substrate and a lower wiring layer under the conductor-cladded insulating substrate; and connecting the inner plated through hole, the upper wiring layer, the outer plated through hole, and the lower wiring layer to form a coil of wire surrounding the ring-typed magnetic component.

The invention still includes other aspects to resolve other problems, some of which will be described in detail together with the abovementioned aspects in the following detail description.

BRIEF DESCRIPTION OF THE DRAWINGS

FIGS. 2A to 8A and FIGS. 2B to 8B are top views and cross-sectional views illustrating the formation of a package structure in accordance with a first embodiment of the present invention.

FIGS. 12A to 16A and FIGS. 12B to 16B are top views and cross-sectional views illustrating the formation of a package structure in accordance with a fourth embodiment of the present invention.

DETAILED DESCRIPTION OF THE INVENTION

Figure 1A:
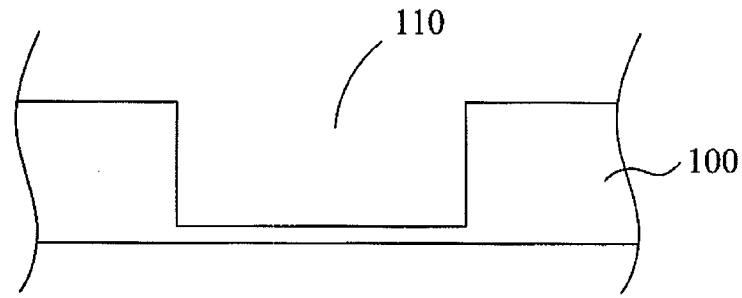
FIGS. 1A to 1C are cross-sectional views illustrating the formation of a conventional package structure.
Figure 1B:
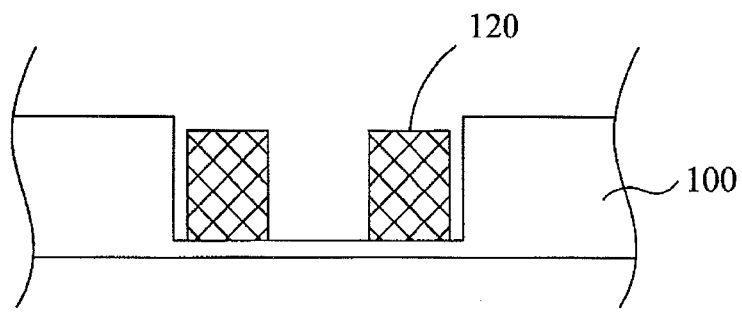
Figure 1C:
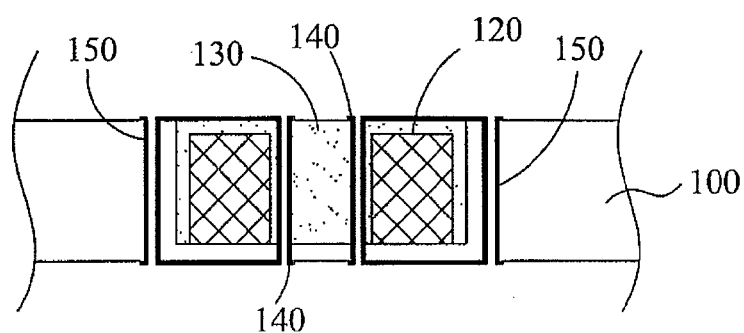

The preferred embodiments of the present invention will now be described in greater details by referring to the drawings that accompany the present application. It should be noted that the features illustrated in the drawings are not necessarily drawn to scale. Descriptions of well-known components, materials, and process techniques are omitted so as to not unnecessarily obscure the embodiments of the invention.

FIGS. 2A to 8A are top views illustrating the formation of a package structure in accordance with the first embodiment of the present invention. FIGS. 2B to 8B are cross-sectional views along the dotted line I-I' respectively shown in FIGS. 2A to 8A.

Figure 2A:
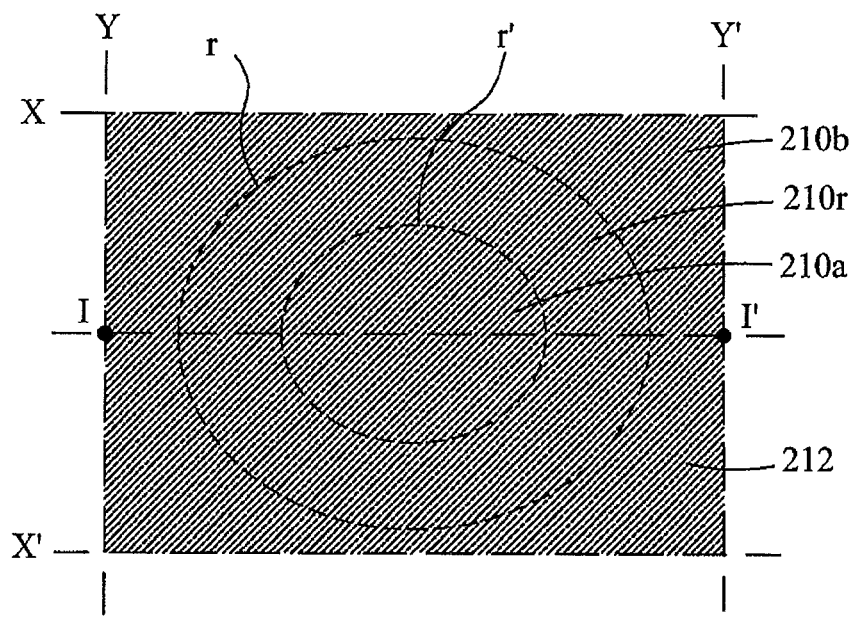
Figure 2B:
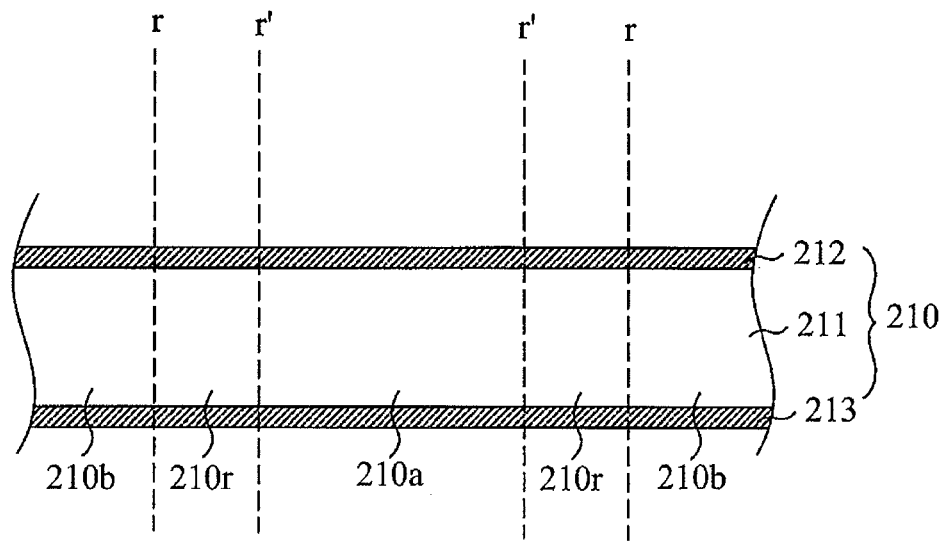

First, referring to FIGS. 2A and 2B, a conductor-cladded insulating substrate 210 is provided. The conductor-cladded insulating substrate 210 includes an insulating substrate 211 cladded with an upper conductor 212 and a lower conductor 213. Preferably in this embodiment, the insulating substrate 211 is a FR-4 substrate comprising woven fiberglass clothe and epoxy resin binder, and the upper and lower conductors 212 and 213 are copper foils. The preferred thickness of the conductor-cladded insulating substrate 210 is ranged between 0.5 mm and 6.0 mm, but not limited thereto. Plan size of the conductor-cladded insulating substrate 210 depends upon design requirements, which can be scaled to fit one or more than one embedded magnetic components alternatively along with other circuits or other embedded components. For clarification, the figures only illustrate a specific region defined by the dotted lines X-X' and Y-Y' for only one magnetic component. As shown in FIG. 2A, in the specific region, the conductor-cladded insulating substrate 210 further defines a ring-typed region 210r between the dotted lines r and r' for embedding, and an isolation portion 210a and a surrounding portion 210b separated by the ring-typed region 210r. Specifically, the ring-typed region 210r is laterally between the island portion 210a and the surrounding portion 210b. Note the preference provided herewith is for illustration purpose, not intended to limit the invention.

Figure 3A:
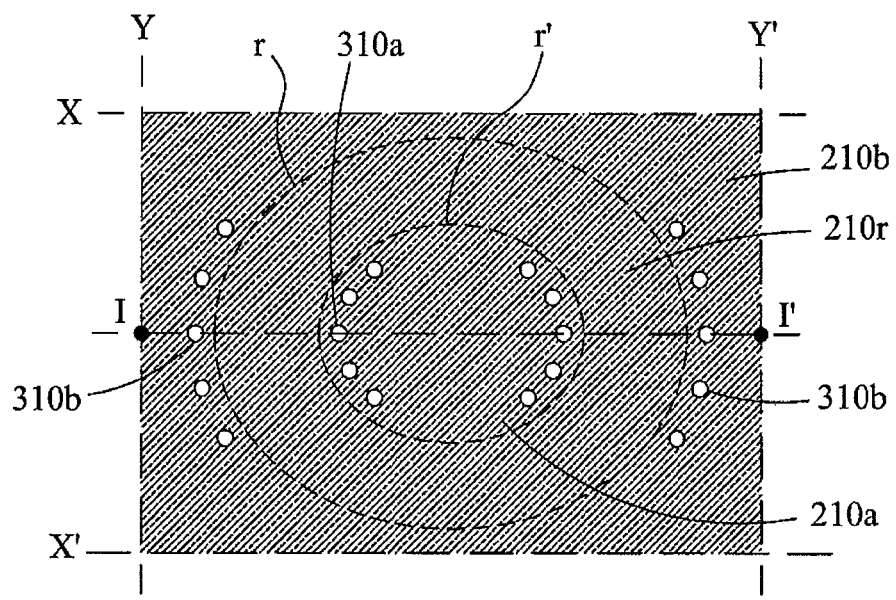
Figure 3B:
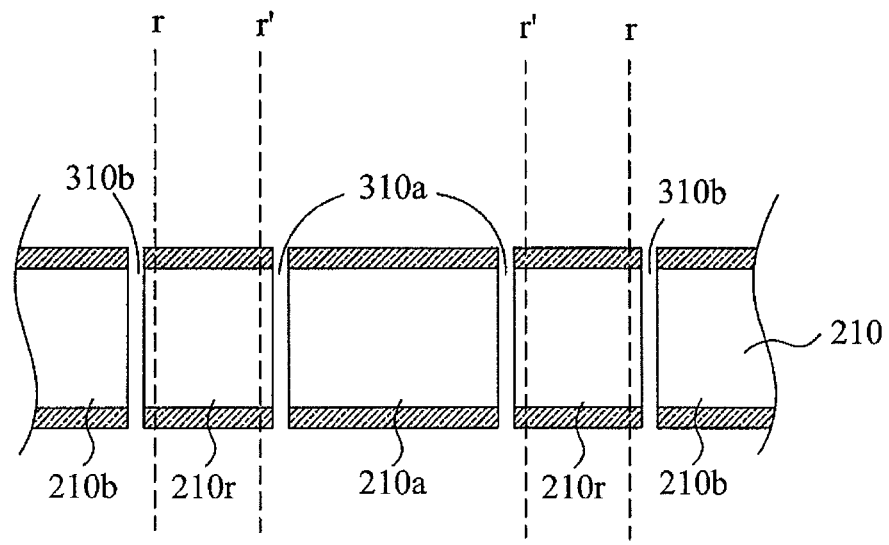

Next, referring to FIGS. 3A and 3B, forming an inner through-hole 310a vertically penetrating the island portion 210a and an outer through hole 310b vertically penetrating the surrounding portion 210b. The through hole 310a and 210b are arranged along the boundary of the ring-typed region 210r. Numbers of the through hole 310a and 310b depend upon design requirements. Methods for forming the through holes 310a and 310b can be mechanical drill, laser drill or any other suitable technology. The preferred hole size of the though hole is ranged from 0.15 mm to 0.3 mm, but not limited thereto.

Figure 4A:
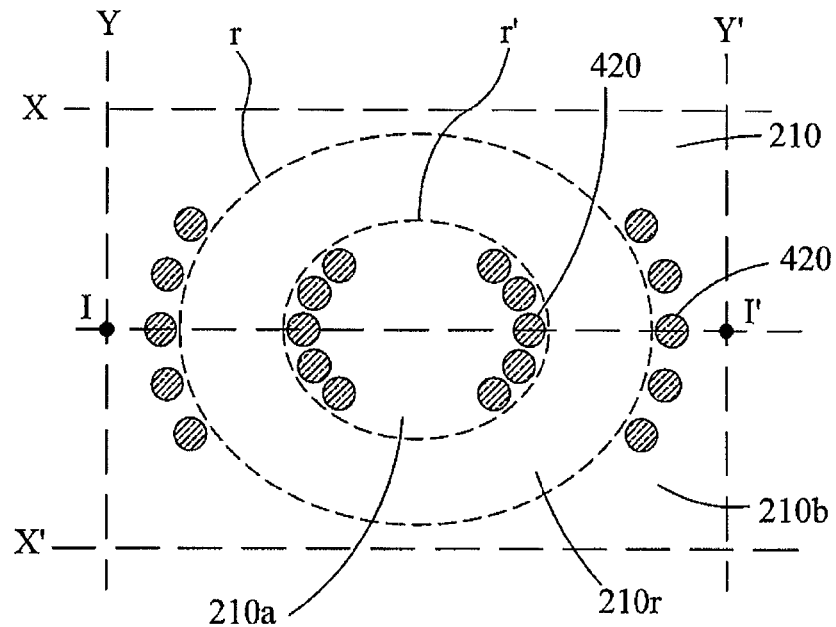
Figure 4B:
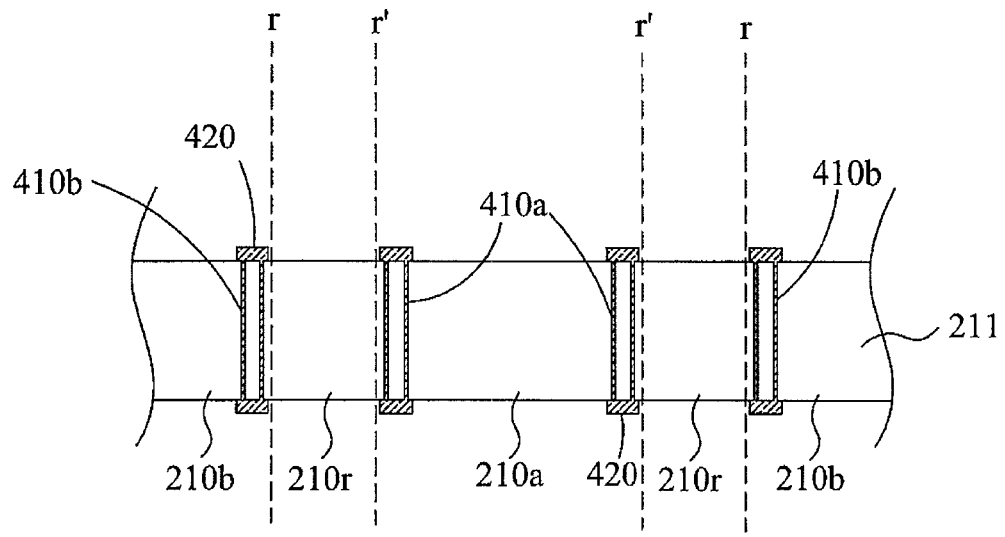

Referring to FIGS. 4A and 4B, the through holes 310a and 310b can be further processed to become inner plated through holes 410a in the isolation portion 210a and outer plated through holes 410b in the surrounding portion 210b. The step can be conducted through desmear process, PTH process and/or other suitable technology. Thereafter, cap layers 420 on two ends of each plated through hole are formed by way of hole plugging, cap plating together with patterning of the upper and lower conductors 212 and 213 using optical lithography.

Figure 5A:
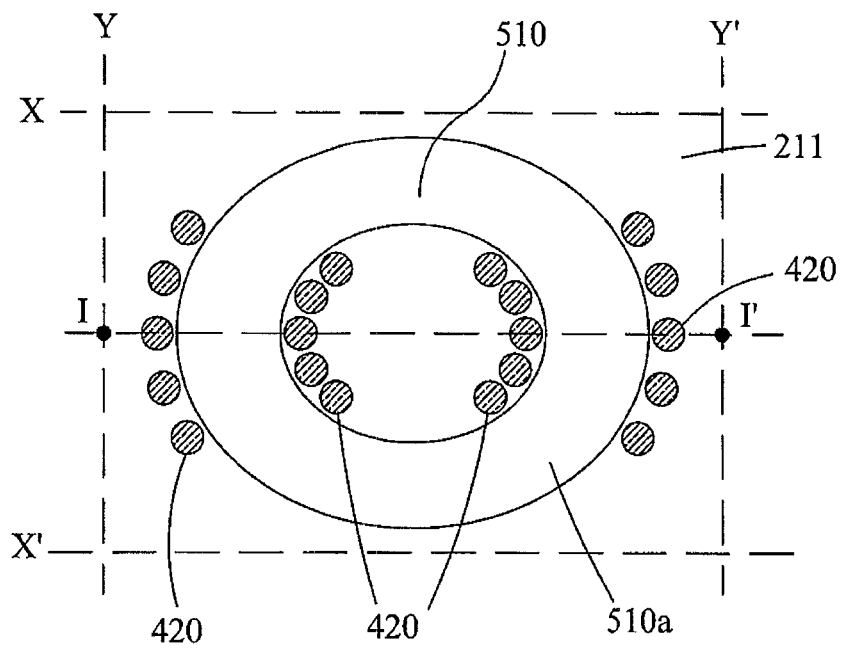
Figure 5B:
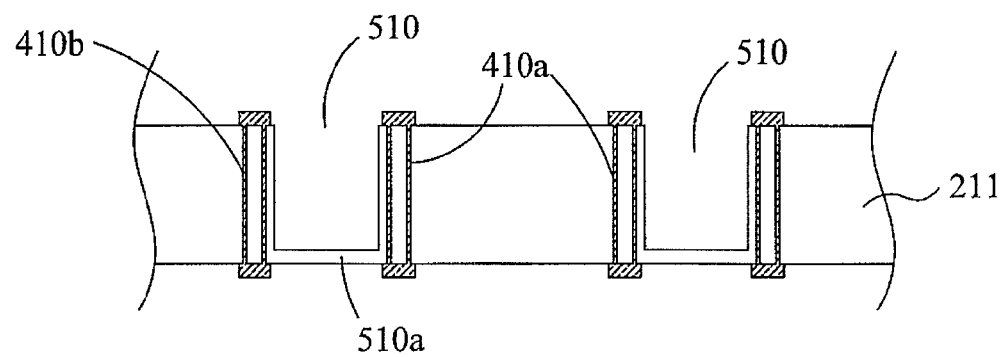

Then, referring to FIGS. 5A and 5B, after forming the inner plated through holes 410a and the outer plated through holes 410b, a ring-typed recess 510 in the ring-typed region 210r for receiving a ring-typed magnetic component 610 (as shown in FIG. 6) is formed. In this embodiment, the ring-typed recess 510 should have enough space to receive the entire ring-typed magnetic component 610. Therefore, the space of the ring-typed recess 510 is preferred larger than the size of ring-typed magnetic component 610. This step of routing the recess 510 is conducted either chemically, mechanically or any other suitable technology. Not that when routing the recess 510, a bottom portion 510a of the insulating substrate 211 is remained by an appropriate depth control.

Figure 6A:
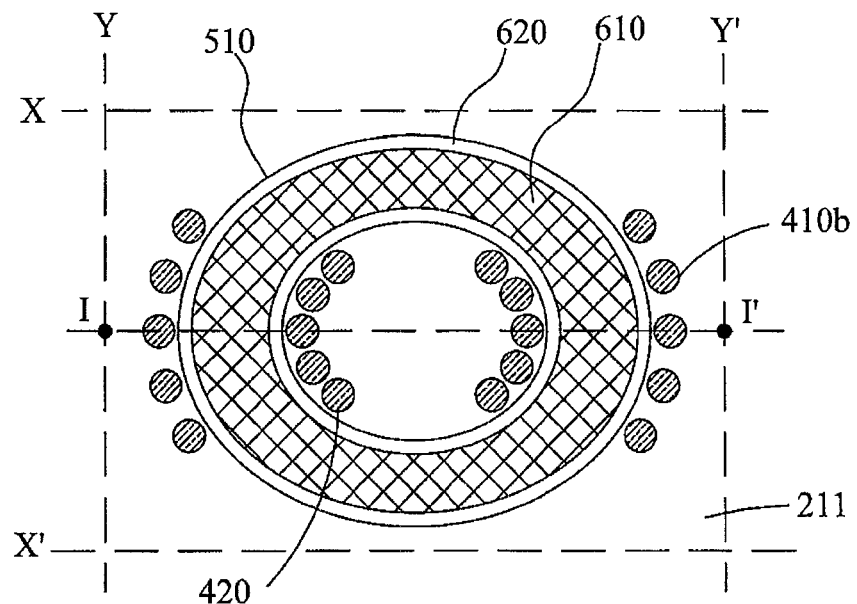
Figure 6B:
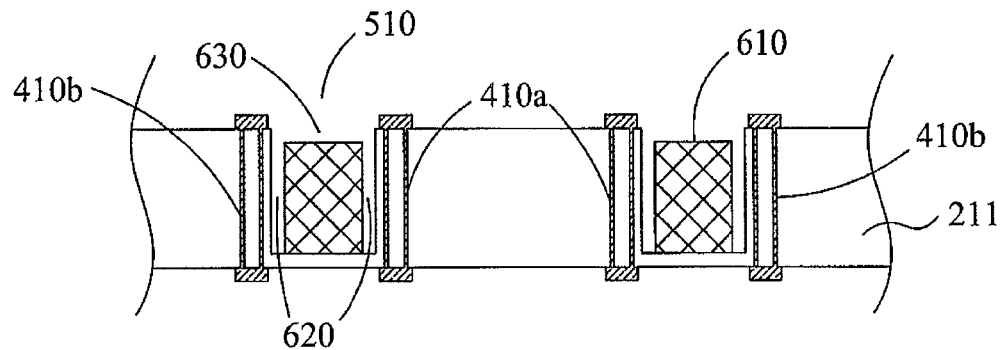

Next, referring to FIGS. 6A and 6B, placing the ring-typed magnetic component 610 into the ring-typed recess 510. Note that the term "ring-typed" means a doughnut-shaped structure, which is here illustrated by two homocentric ellipses in all top views of the figures. The shape is not limited to ellipse. Any other suitable shapes, such as rectangle or polygons, are included in the invention. The ring-typed magnetic component 610 can be a ferrite core or any other objects suitable for electromagnetic applications. Preferably, the thickness of the ring-typed magnetic component 610 is between 0.8 mm and 3.0 mm, but not limited thereto.

Still referring FIGS. 6A and 6B, as the space of the ring-typed recess 510 larger than the size of the magnetic component 610, there is a gap 620 between the inner wall of the ring-typed recess 510 and the magnetic component 610. Meanwhile, as the depth of the ring-typed recess 510 higher than the thickness of the ring-typed magnetic component 610, there is a vacancy 630 above the magnetic component 610 and below the top surface of the insulating substrate 211. In the embodiment, the gap 620 and the vacancy 630 are full of air.

Figure 7A:
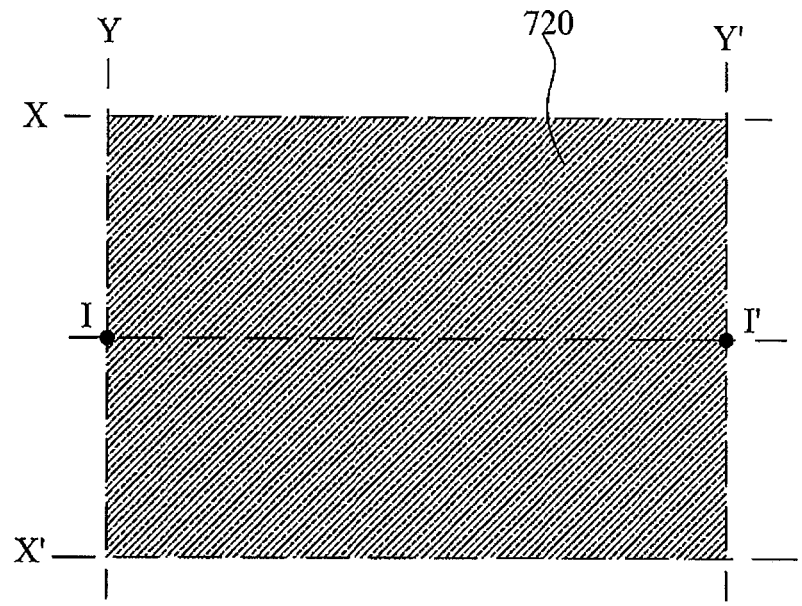
Figure 7B:
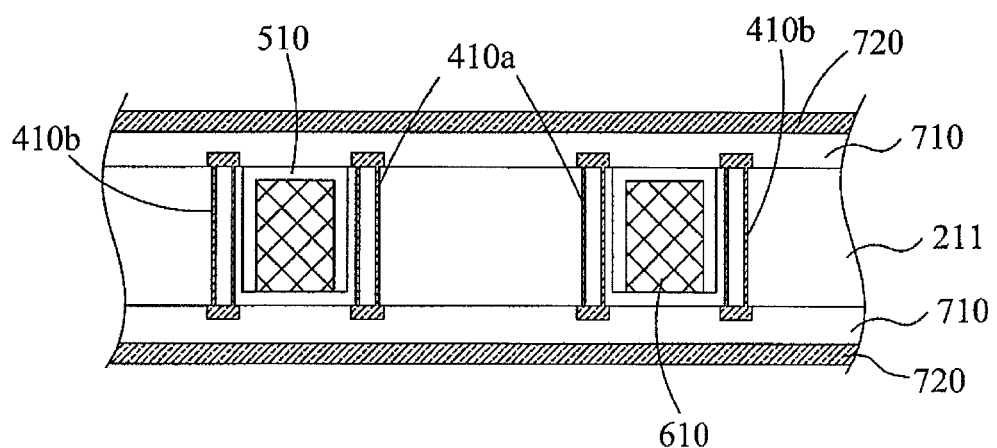

Referring to FIGS. 7A and 7B, after placing of the ring-typed magnetic component 610 into the ring-typed recess 510, the dielectric layers 710 together with conductive layers 720 are attached onto the front side and the backside of the insulating substrate 211. The dielectric layers 710, for adhesion purpose, can be an epoxy based bondply or any other suitable materials. The conductive layer 720 can be a single side copper-cladded laminate or any other suitable materials. In this embodiment, two sheets of the single side copper-cladded laminates (i.e. the conductive layer 720) are respectively adhered to the front and back sides of the insulating substrate 211 through the adhesive bondplys (i.e. the dielectric layers 710) by the conventional pressing technology. Preferably, the thickness of the dielectric layers 710 or the conductive layer 720 is not less than 0.05 mm, but it is not limited thereto. Note that in this embodiment, the gap 620 and the vacancy 630 are full of air as the adhesive bondply is a non-flow type with trace gel liquid generated during pressing. However, in another embodiment, the adhesive bondply (i.e. the dielectric layers 710) may include flow-type substances, which will generate an amount of gel liquid during pressing. The gel liquid will then flow into the gap 620 or even further fill up the vacancy 630.

Figure 8A:
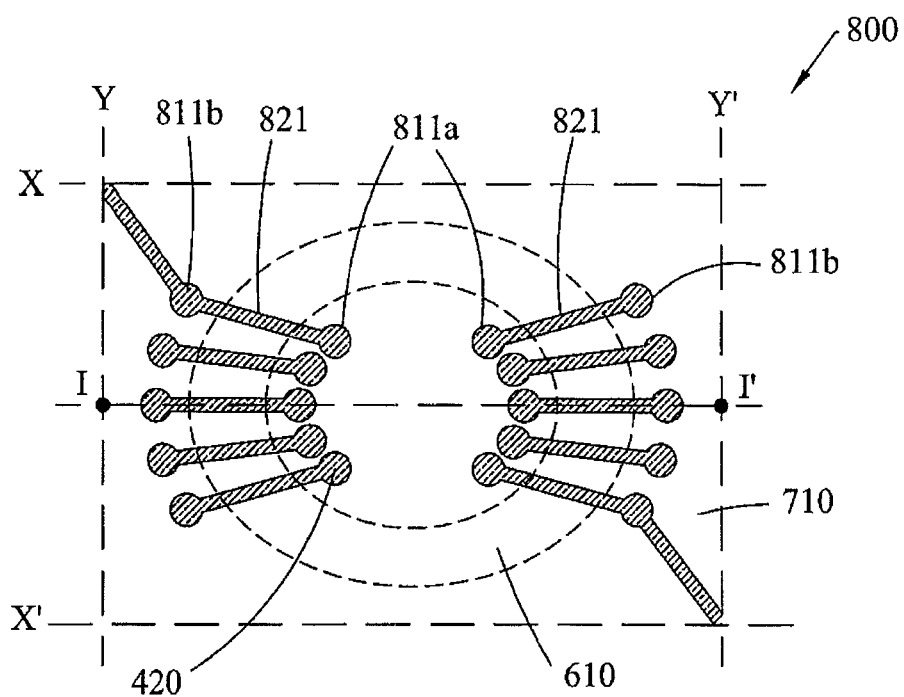
Figure 8B:
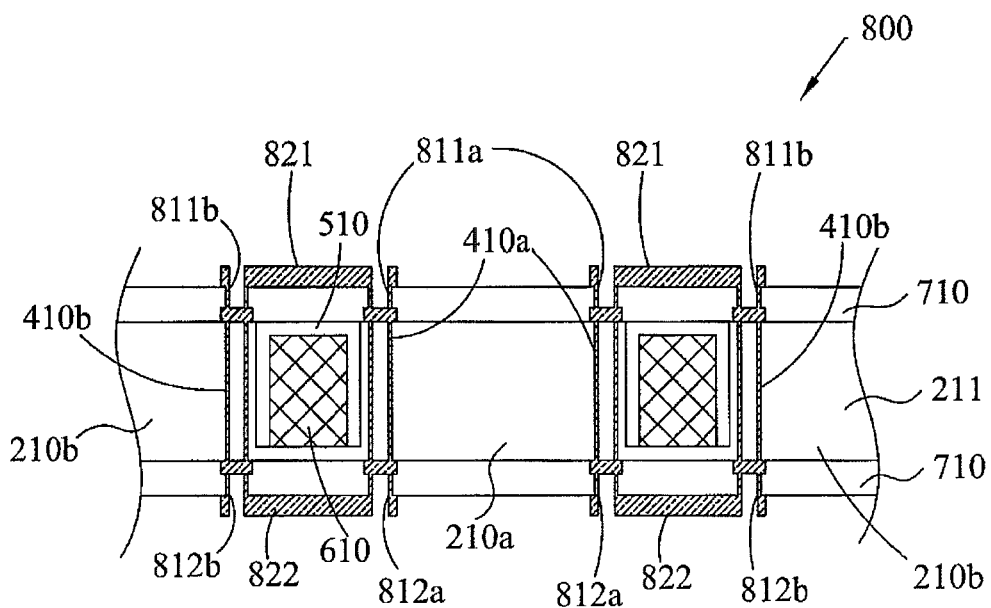

Next, referring to FIGS. 8A and 8B, after the dielectric layer 710 and the conductor layer 720 are attached thereon, inner plated through holes 811a, outer plated through hole 811b, inner plated through holes 812a and outer plated through hole 812b respectively penetrating the upper and lower dielectric layers 710 and the upper and lower conductor layers 720 are formed by way of drilling, desmear and PTH process. The plated through holes 811a, 811b in the upper level are respectively connected with the plated through hole 410a and 410b in the middle level through the cap layers 420. Similarly, in the lower lever, the plated through holes 812a, 812b are respectively connected with the plated through hole 410a and 410b in the middle level through the cap layers 420. Thereafter, the upper and lower conductor layers 710 are respectively patterned to form a upper wiring layer 821 and lower wiring layer 822 by way of the conventional optic lithography.

FIGS. 8A and 8B illustrate the package structure 800 according to the first embodiment of the invention. From the structural point of view, as shown in the figures, the package structure 800 includes the insulating substrate 211 having a ring-typed recess 510, an island portion 210a and a surrounding portion 210b defined by the ring-typed recess 510, wherein the ring-typed recess 510 is laterally between the island portion 210a and the surrounding portion 210b. The ring-typed magnetic component 610 is placed in the ring-typed recess 510. In FIG. 8A, the ring-typed magnetic component 610 is indicated by dotted lines, as it is embedded in the package structure 800. The package structure 800 further includes the upper wiring layer 821 above the insulating substrate 211 and the lower wiring layer 822 under the insulating substrate 211; the inner plated through hole 410a vertically passing through the island portion 210a and extending upwardly and downwardly to connect the upper wiring layer 821 and the lower wiring layer 822; and the outer plated through hole 410b vertically passing through the surrounding portion 210b and extending upwardly and downwardly to connect the upper wiring layer 821 and the lower wiring layer 822. The inner plated through hole 410a, the outer plated through hole 410b, the upper wiring layer 821 and the lower wiring layer 822 therefore form a coil of wire surrounding the ring-typed magnetic component 610. The package structure 800 further includes a dielectric layer 710 between the insulating substrate 211 and the upper wiring layer 821. Note that there are inner plated through holes 811a and outer plated through holes 811b (i.e. upwardly extended portions from the inner plated through holes 410a and the outer plated through holes 410b) penetrating the dielectric layer 710, thereby allowing the inner plated through holes 410a and the outer plated through holes 410b electronically connect the upper wiring layer 821. Similarly, There are inner plated through holes 812a and outer plated through holes 812b (i.e. downwardly extended portions from the inner plated through holes 410a and the outer plated through holes 410b) penetrating the dielectric layer 710, thereby allowing the inner plated through holes 410a and the outer plated through holes 410b electronically connect the lower wiring layer 822.

Figure 9:
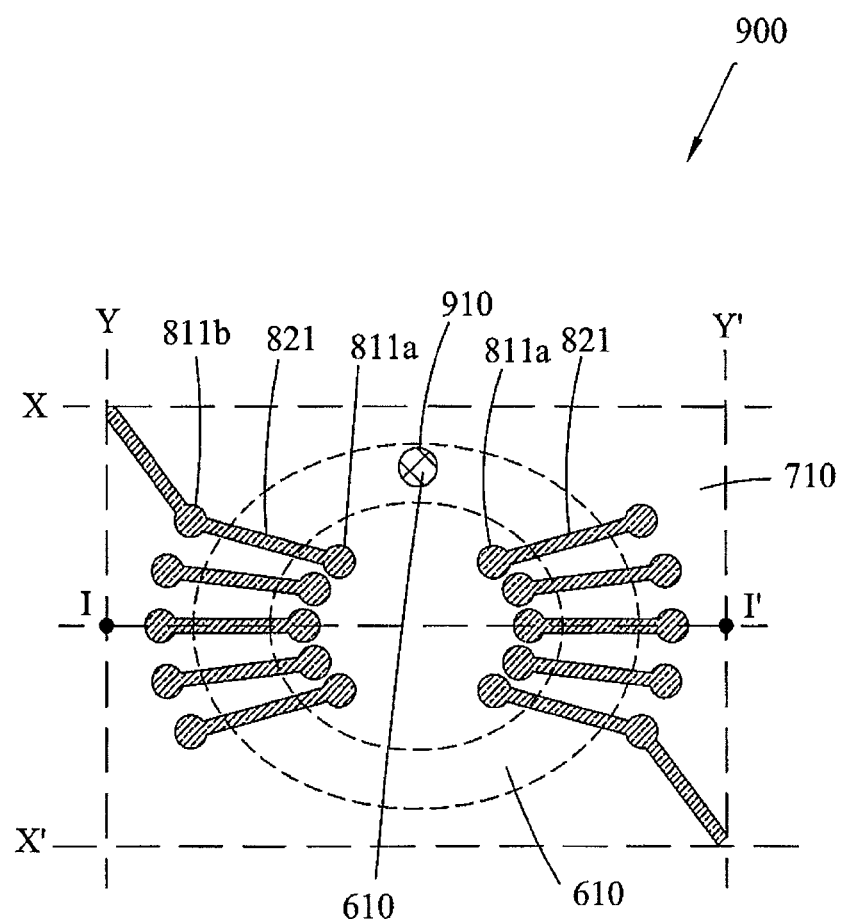
FIG. 9 is a top view illustrating a package structure in accordance with a second embodiment of the present invention.

FIG. 9 is a top view illustrating a package structure 900 in accordance with the second embodiment of the present invention. The package structure 900 differs from the package structure 800 of the first embodiment in an air outlet 910 penetrating the dielectric layer 710 between the insulating layer 211 and the upper wiring layer 821. The air outlet 910 is formed to communicate the ring-typed recess 510 with an outside of the package structure 900. The air outlet 910 might expose the magnetic component 610. In this embodiment, air is full of the gap 620 and the vacancy 630 as aforementioned. The air outlet 910 help the gap and the vacancy communicate with atmosphere out of the package structure 900 to prevent the undesired air burst in any high-pressure condition.

Note that the invention includes any methods changing the order of the steps of the first embodiment in a suitable way. For example, although in the embodiment that the thorough holes 310A and 310b are formed before the formation of the ring-typed recess 510, as shown in FIGS. 3A, 3B to FIGS. 5A, 5B, the invention also includes the method of making the same by forming the ring-typed recess 510 in advance.

Figure 10A:
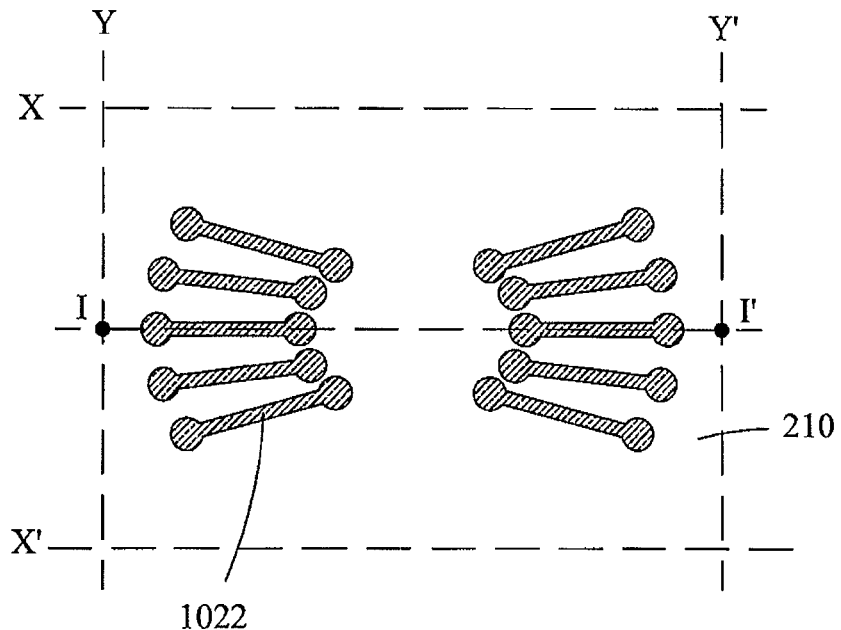
FIGS. 10A, 10B and FIG. 11 are top views and cross-sectional views illustrating the formation of a package structure in accordance with a third embodiment of the present invention.
Figure 10B:
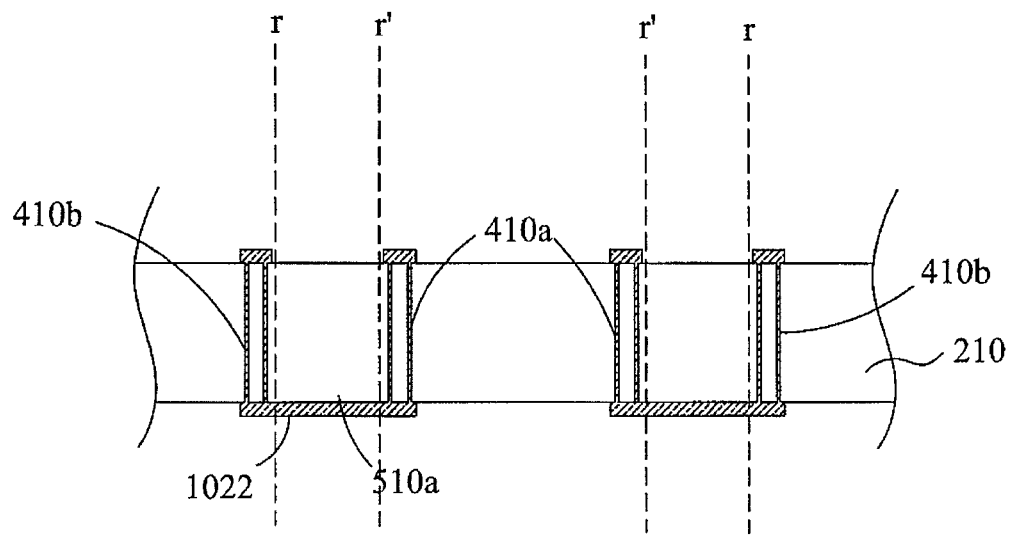
Figure 11:
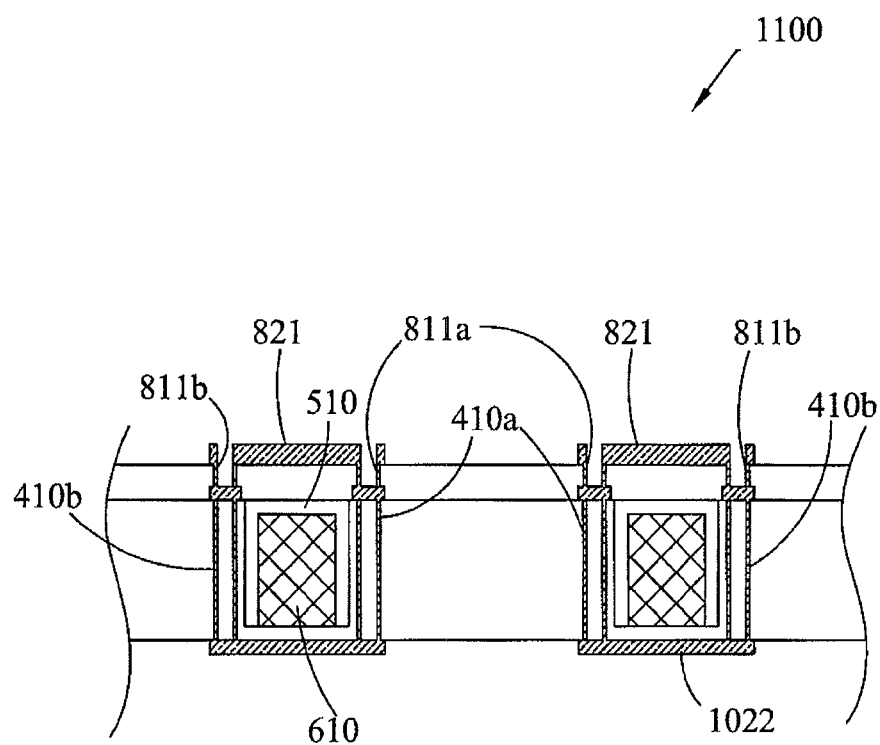

FIGS. 10A, 10B and FIG. 11 are top views and cross-sectional views illustrating the formation of a package structure in accordance with a third embodiment of the present invention, wherein FIG. 10A is a bottom view of the structure, FIG. 10B is a cross-sectional view along the dotted line I-I' of the FIG. 10A, and FIG. 11 is another cross-sectional view for a step following the step of FIG. 10B. The third embodiment differs from the first embodiment in that, in the third embodiment the dielectric layer 710 and the conductor layer 721 are formed only on the front side exposing the ring-typed recess 510 of the insulating substrate 211 while in the first embodiment there are two dielectric layers 710 together with the conductive layers 720 respectively formed on both the front and back sides of the insulating substrate 211. In other words, forming the dielectric layer 710 on the backside is not a must, as there remains the bottom portion 510a of the insulating substrate 211 for the dielectric purpose.

Therefore, as shown in FIG. 10B, a lower wiring layer 1022 of the third embodiment is formed directly on the surface of the bottom portion 510a of the insulating substrate 211. FIG. 10A illustrates the lower wiring 1022 whose pattern is similar to the pattern of the lower wiring 822. The step of forming the lower wiring layer 1022 can be conducted prior to or after the formation of the ring-typed recess 510 while in the third embodiment the lower wiring layer 1022 is formed prior thereto. Specifically, the step of FIG. 10B can be conducted following the step of FIG. 3B. That is, the lower wiring layer 1022 is from the lower conductor 213. Then, after the step of FIGS. 10A and 10B, proceed the steps referring to the first embodiment such that the package structure 1100 of FIG. 11 can be obtained.

FIGS. 12A to 16A are top views illustrating the formation of a package structure 1600 in accordance with the fourth embodiment of the present invention. FIGS. 12B to 16B are cross-sectional views along the dotted line I-I' respectively shown in FIGS. 12A to 12A. The package structure 1600 of the fourth embodiment is formed with two conductive levels while the package structure 800 of the first embodiment is formed with four conductive levels and the package structure 1100 of the third embodiment is formed with three conductive levels.

Figure 12A:
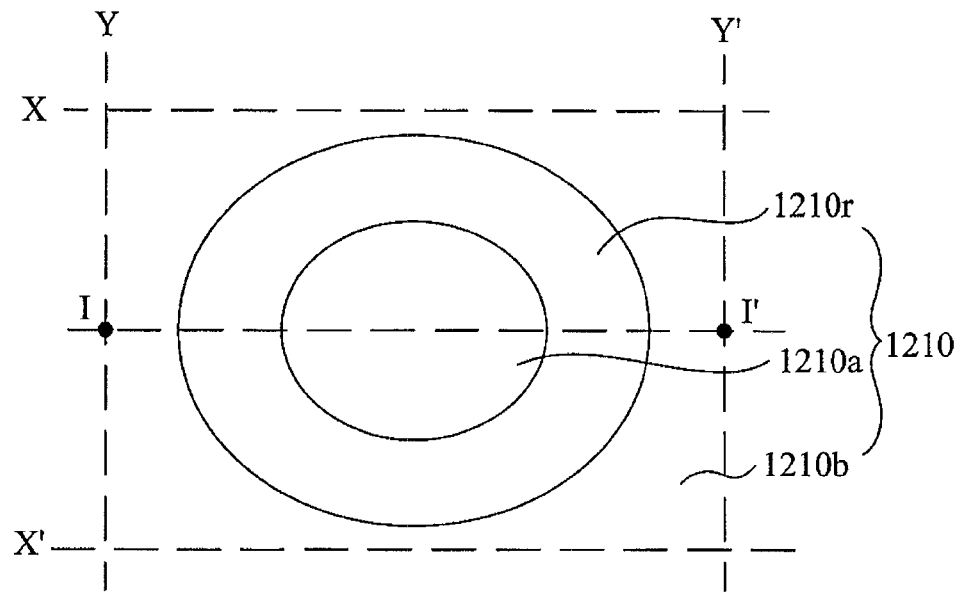
Figure 12B:
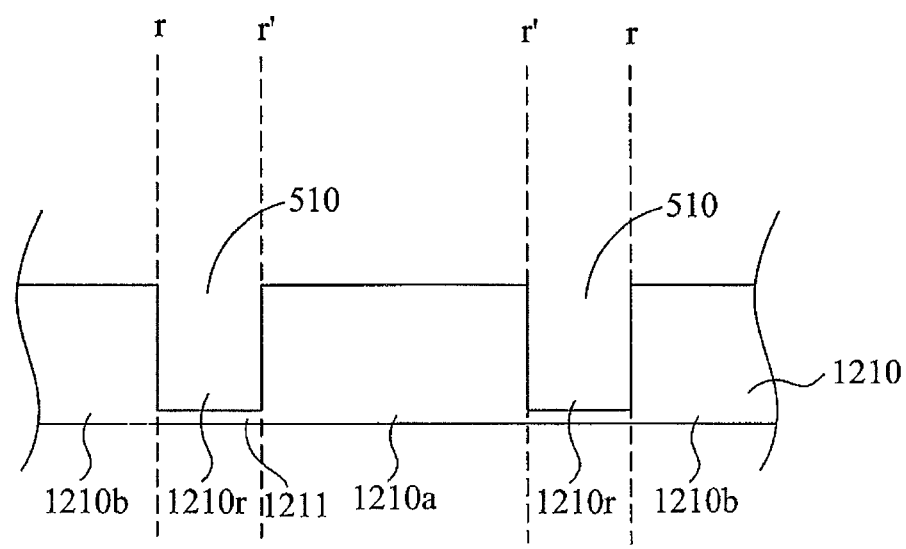

Referring to FIGS. 12A and 12B, an insulating substrate 1210 with a ring-typed recess 510 for receiving a ring-typed magnetic component is provided. The insulating substrate 1210 can be an epoxy based glass fiber substrate or a molded material such as LCP. The preferred thickness of the insulating substrate 1210 is ranged between 0.5 mm and 6.0 mm, but not limited thereto. Plan size of the insulating substrate 1210 depends upon design requirements, which can be scaled to fit one or more than one embedded magnetic components alternatively along with other circuits or other embedded components. For clarification, the figures only illustrate a specific region defined by the dotted lines X-X' and Y-Y' for only one magnetic component. As shown in FIG. 12A, in the specific region, the insulating substrate 1210 further defines a ring-typed region 1210r between the dotted lines r and r' for embedding, and an isolation portion 1210a and a surrounding portion 1210b separated by the ring-typed region 1210r. Specifically, the ring-typed region 1210r is laterally between the island portion 1210a and the surrounding portion 1210b. In this embodiment, the ring-typed recess 510 should have enough space to receive the entire ring-typed magnetic component. Therefore, the space of the ring-typed recess 510 is preferred larger than the size of ring-typed magnetic component. This step of routing the recess 510 is conducted either chemically, mechanically or any other suitable technology. Not that when routing the recess 510, a bottom portion 510a of the insulating substrate 1210 is remained by an appropriate depth control.

Figure 13A:
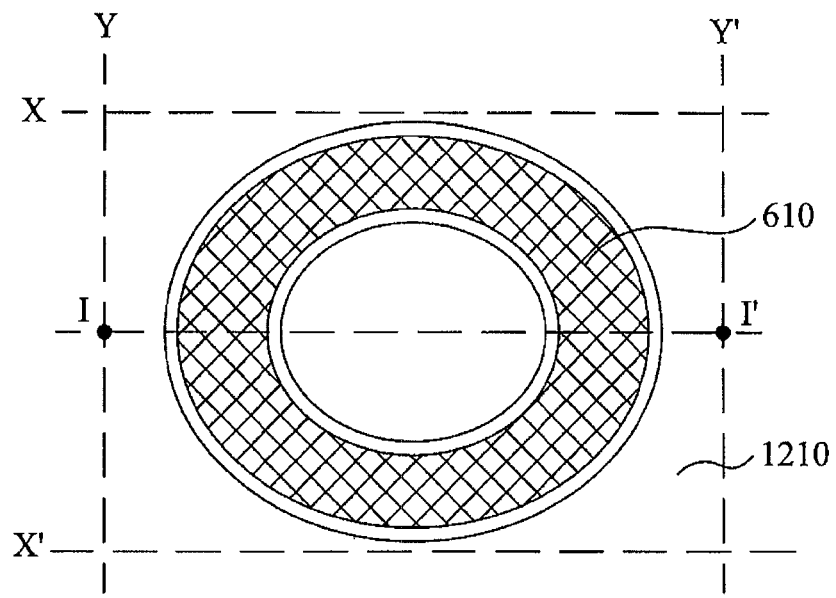
Figure 13B:
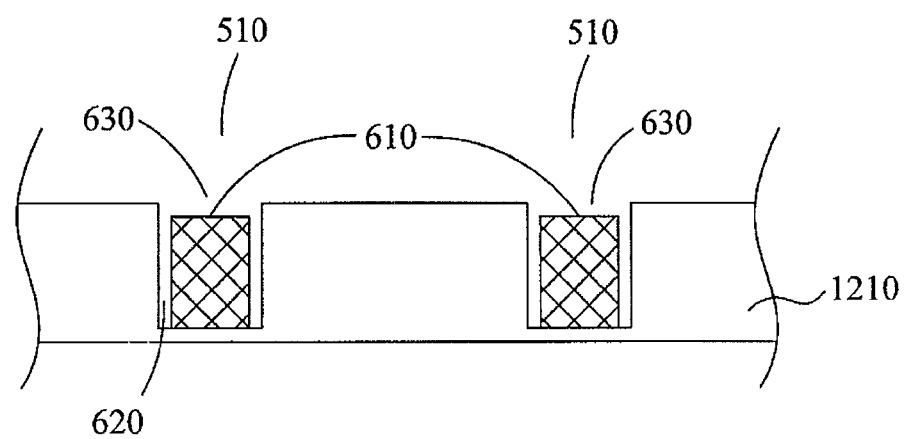

Next, referring to FIGS. 13A and 13B, placing the ring-typed magnetic component 610, as mentioned in the first embodiment, into the ring-typed recess 510. Still referring FIGS. 13A and 13B, as the space of the ring-typed recess 510 larger than the size of the magnetic component 610, there is a gap 620 between the inner wall of the ring-typed recess 510 and the magnetic component 610. Meanwhile, as the depth of the ring-typed recess 510 higher than the thickness of the ring-typed magnetic component 610, there is a vacancy 630 above the magnetic component 610 and below the top surface of the insulating substrate 1210. In the embodiment, the gap 620 and the vacancy 630 are full of air.

Figure 14A:
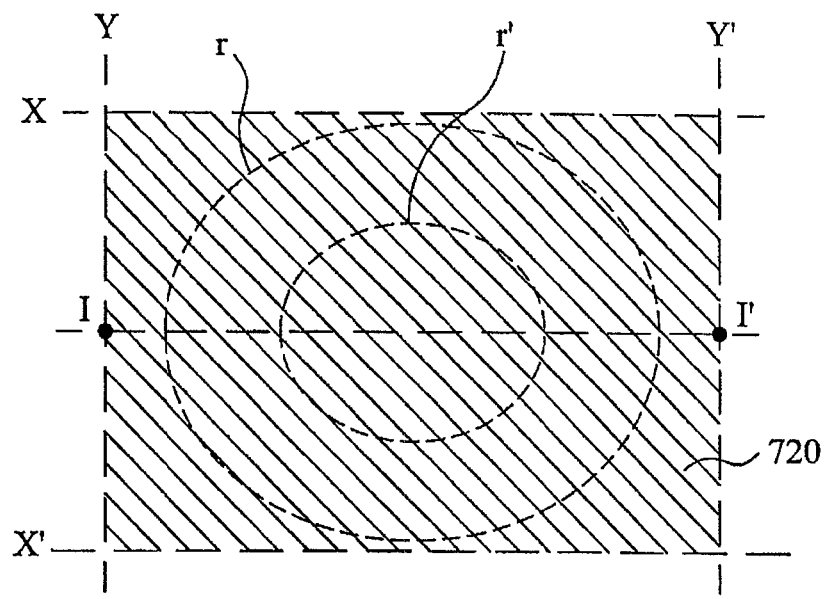
Figure 14B:
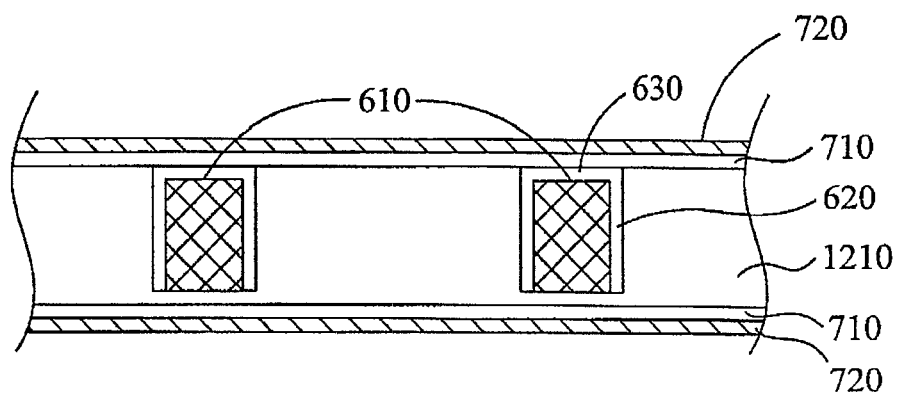

Referring to FIGS. 14A and 14B, after placing of the ring-typed magnetic component 610 into the ring-typed recess 510, dielectric layers 710 together with conductive layers 720, as mentioned in the first embodiment, are attached onto the front side and the backside of the insulating substrate 1210. Specifically, in this embodiment, two sheets of the single side copper-cladded laminates (i.e. the conductive layer 720) are respectively adhered to the front and back sides of the insulating substrate 1210 through the adhesive bond-plys (i.e. the dielectric layers 710) by the conventional pressing technology. Note that in this embodiment, the gap 620 and the vacancy 630 are full of air as the adhesive bondply is a non-flow type with trace gel liquid generated during pressing. However, in another embodiment, the adhesive bondply (i.e. the dielectric layers 710) may include flow-type substances, which will generate an amount of gel liquid during pressing. The gel liquid will then flow into the gap 620 or even further fill up the vacancy 630.

Figure 15A:
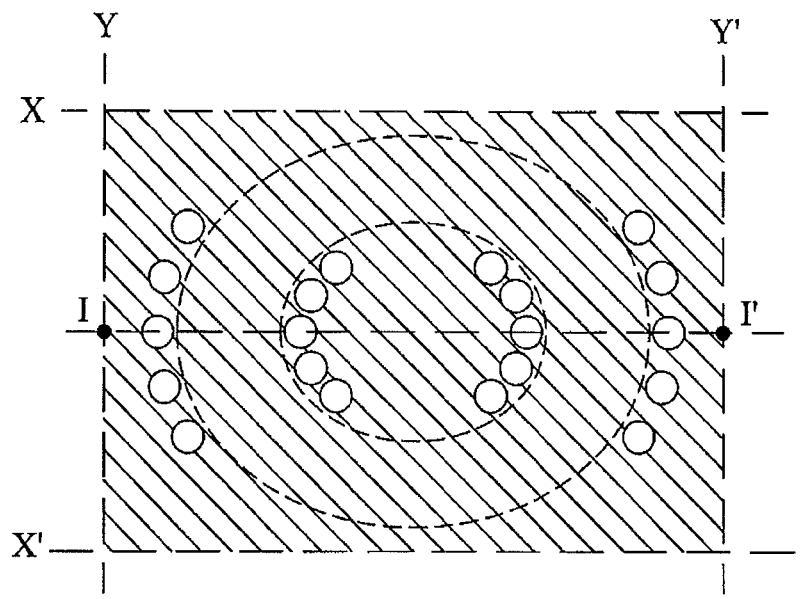
Figure 15B:
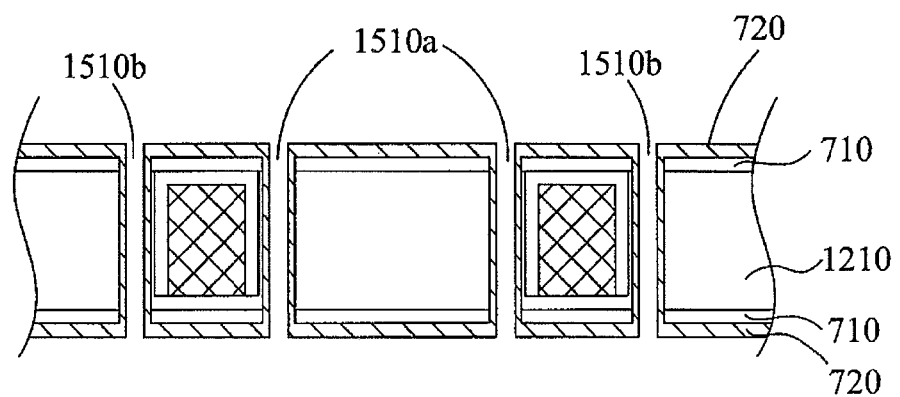
Figure 16A:
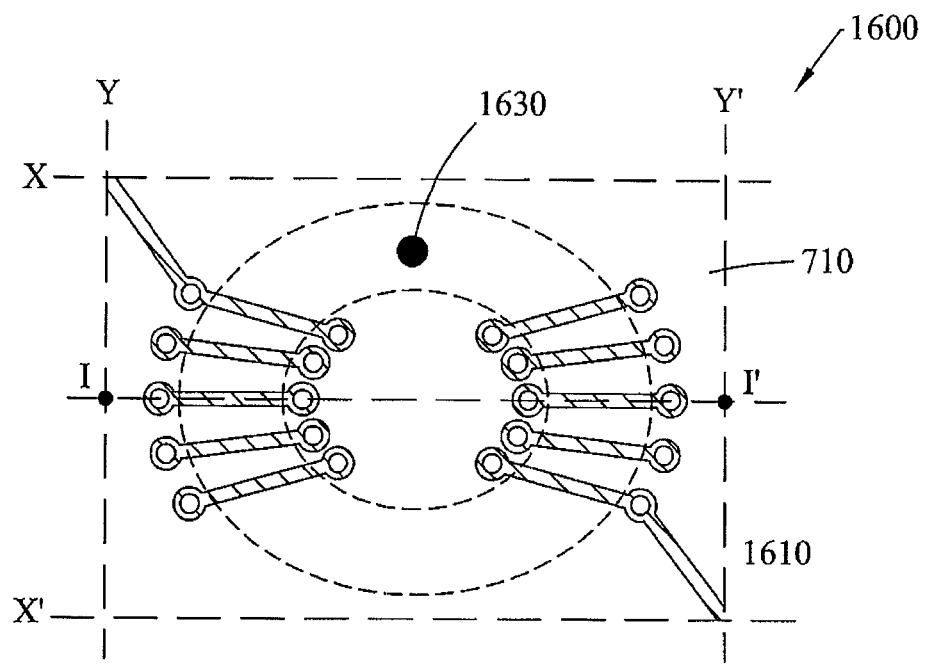
Figure 16B:
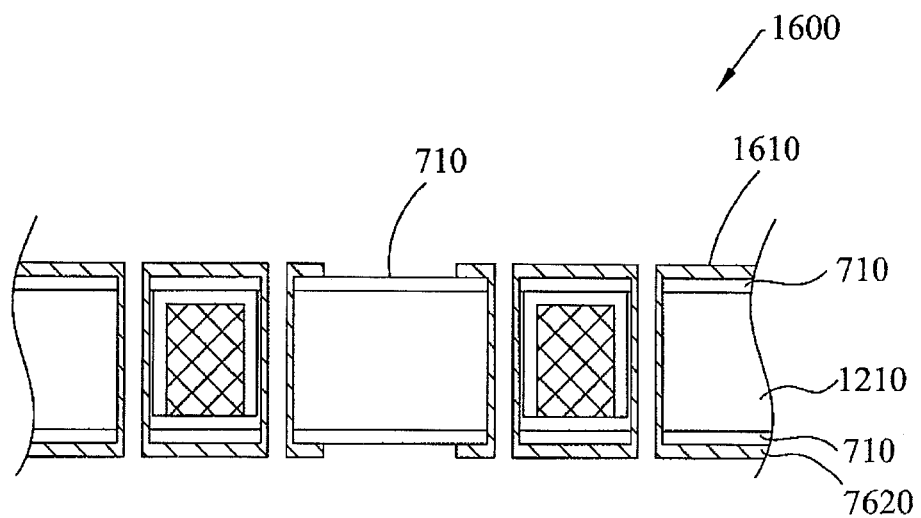

Next, referring to FIGS. 15A and 15B, after the dielectric layer 710 and the conductor layer 720 are attached thereon, inner plated through holes 1510a and outer plated through hole 1510b respectively penetrating the insulating substrate 1210, the upper and lower dielectric layers 710 and the upper and lower conductor layers 720 are formed by way of drilling, desmear and PTH process. Thereafter, referring to FIGS. 16A and 16B, the upper and lower conductor layers 720 are respectively patterned to form a upper wiring layer 1610 and lower wiring layer 1620 by way of the conventional optic lithography. Note that, in the embodiment, an air outlet 1630 penetrating the dielectric layer 710 to expose the ring-typed recess 510 is optionally formed. The air outlet 1630 is made to communicate the ring-typed recess 510 with an outside of the package structure 1600. The air outlet 1630 might expose the magnetic component 610. In this embodiment, air is full of the gap 620 and the vacancy 630. The air outlet 910 help the gap and the vacancy communicate with atmosphere out of the package structure 900 to prevent the undesired air burst in any high-pressure condition.

Although specific embodiments have been illustrated and described, it will be obvious to those skilled in the art that various modifications may be made without departing from what is intended to be limited solely by the appended claims.

What is claimed is:

1. A package structure comprising:
an insulating substrate having a ring-typed recess, an island portion and a surrounding portion defined by the ring-typed recess, wherein the ring-typed recess is laterally between the island portion and the surrounding portion;
a ring-typed magnetic component placed in the ring-typed recess, wherein a gap is between an inner wall of the ring-typed recess and the ring-typed magnetic component, and the gap is full of air;
an upper wiring layer above the insulating substrate and a lower wiring layer under the insulating substrate;
a dielectric layer placed between the insulating substrate and the upper wiring layer or between the insulating substrate and the lower wiring layer;
an inner cap layer and an outer cap layer respectively formed between the dielectric layer and the insulating substrate;
an inner plated through hole vertically passing through the island portion to connect the inner cap layer and further passing through the dielectric layer to connect the upper wiring layer or the lower wiring layer; and
an outer plated through hole vertically passing through the surrounding portion to connect the outer cap layer and further passing through the dielectric layer to connect the upper wiring layer or the lower wiring layer,
wherein the inner cap layer and the outer cap layer respectively plug the inner plated through hole and the outer plated through hole; and
wherein the inner plated through hole, the outer plated through hole, the upper wiring layer and the lower wiring layer forms a coil of wire surrounding the ring-typed magnetic component.

2. A package structure comprising:
an insulating substrate having a ring-typed recess, an island portion and a surrounding portion defined by the ring-typed recess, wherein the ring-typed recess is laterally between the island portion and the surrounding portion;
a ring-typed magnetic component placed in the ring-typed recess;
an upper wiring layer above the insulating substrate and a lower wiring layer under the insulating substrate;
an inner plated through hole vertically passing through the island portion and connecting the upper wiring layer and the lower wiring layer;
an outer plated through hole vertically passing through the surrounding portion and connecting the upper wiring layer and the lower wiring layer, wherein the inner plated through hole, the outer plated through hole, the upper wiring layer and the lower wiring layer forms a coil of wire surrounding the ring-typed magnetic component;
a dielectric layer between the insulating substrate and the upper wiring layer, wherein the inner plated through hole and the outer plated through hole penetrate the dielectric layer; and
an air outlet penetrating the dielectric layer to communicate the ring-typed recess with an outside of the package structure.

* * * * *